United States Patent
Fukuda et al.

(10) Patent No.: US 10,538,702 B2
(45) Date of Patent: Jan. 21, 2020

(54) FLUORESCENT MATERIAL, LIGHT-EMITTING DEVICE, AND METHOD FOR PRODUCING FLUORESCENT MATERIAL

(71) Applicant: Ube Industries, Ltd., Ube-shi (JP)

(72) Inventors: Kouichi Fukuda, Ube (JP); Kaoru Takazaki, Ube (JP); Jin Amagai, Ube (JP); Toru Inagaki, Ube (JP); Masaki Tanaka, Ube (JP); Tatsunori Sakaguchi, Ube (JP)

(73) Assignee: Ube Industries, Ltd., Ube-shi (JP)

( * ) Notice: Subject to any disclaimer, the term of this patent is extended or adjusted under 35 U.S.C. 154(b) by 294 days.

(21) Appl. No.: 15/540,290

(22) PCT Filed: Dec. 25, 2015

(86) PCT No.: PCT/JP2015/086219
§ 371 (c)(1),
(2) Date: Jun. 28, 2017

(87) PCT Pub. No.: WO2016/111200
PCT Pub. Date: Jul. 14, 2016

(65) Prior Publication Data
US 2017/0349823 A1    Dec. 7, 2017

(30) Foreign Application Priority Data
Jan. 7, 2015 (JP) ................. 2015-001827

(51) Int. Cl.
C09K 11/77 (2006.01)
C09K 11/08 (2006.01)
C09K 11/59 (2006.01)

(52) U.S. Cl.
CPC ...... *C09K 11/7731* (2013.01); *C09K 11/0816* (2013.01); *C09K 11/0822* (2013.01); *C09K 11/592* (2013.01)

(58) Field of Classification Search
CPC .......................... C09K 11/7792; H01L 33/502
See application file for complete search history.

(56) References Cited

U.S. PATENT DOCUMENTS 9,011,718 B2 * 4/2015 Fukuda ............ C09K 11/7734
                                                252/301.4 F
2013/0200777 A1   8/2013 Inagaki et al.
2014/0084780 A1   3/2014 Fukuda et al.

FOREIGN PATENT DOCUMENTS

| JP | 2010209206 A | 9/2010 |
| JP | 201335957 A | 2/2013 |
| WO | 03097767 A1 | 11/2003 |
| WO | 2012033122 A1 | 3/2012 |

OTHER PUBLICATIONS

International Search Report re PCT/JP2015/086219, dated Mar. 15, 2016.
Chu Jun Fu et al., "Controllable luminescent properties of phosphors Sr2.97-xCaxMgSi2O8: Eu0.012+, Dy0.023+ by adjusting Sr/Ca ratio", Materials Science Forum, vols. 663-665(2011), pp. 118-124.
Jiao, "Study on Eu or Tb Doped Alkaline Earth Polysilicate Phosphors", A Dissertation for the Degree of M. Engineering, Jun. 2009, 84 pages, English-language Abstract.

* cited by examiner

*Primary Examiner* — C Melissa Koslow
(74) *Attorney, Agent, or Firm* — The Webb Law Firm

(57) ABSTRACT

The present invention is a fluorescent material characterized by being represented by a composition of the following formula (1) and having a crystal lattice distortion obtained from a Williamson-Hall plot by X-ray diffraction within the range of 0.0005 to 0.0020.

$$(Sr,Ca,M)_{3-x}MgSi_2O_8{:}Eu_x \qquad \text{formula (1)}$$

wherein M is at least one rare earth metal elements selected from the group consisting of Sc, Y, Gd, Tb and La, and $0.01 \leq x \leq 0.10$. Also, the present invention is a light-emitting device including the fluorescent material, and a light source that emits light by irradiating the fluorescent material with excitation light. Furthermore, the present invention is a method for producing the fluorescent material, including the steps of: obtaining an aqueous slurry of a raw material; and spray-drying the aqueous slurry with hot air at 80 to 300° C.

8 Claims, 1 Drawing Sheet

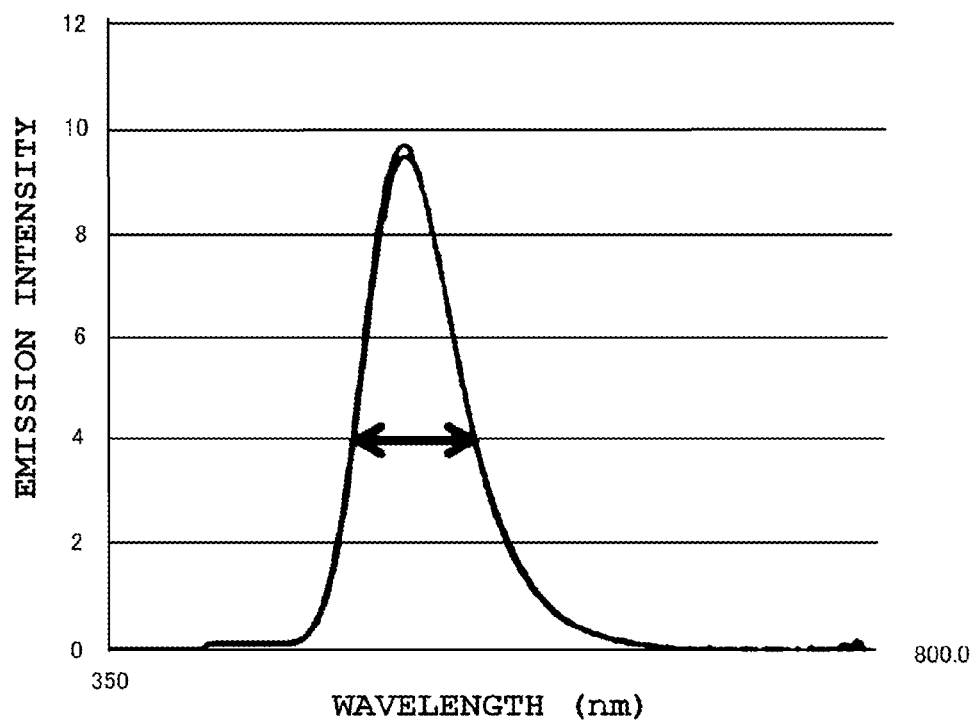

FLUORESCENT MATERIAL, LIGHT-EMITTING DEVICE, AND METHOD FOR PRODUCING FLUORESCENT MATERIAL

CROSS-REFERENCE TO RELATED APPLICATIONS

This application is the United States national phase of International Application No. PCT/JP2015/086219 filed Dec. 25, 2015, and claims priority to Japanese Patent Application No. 2015-001827 filed Jan. 7, 2015, the disclosures of which are hereby incorporated in their entirety by reference.

TECHNICAL FIELD

The present invention relates to a fluorescent material, a light-emitting device, and a method for producing a fluorescent material, and particularly relates to a silicate-based fluorescent material, a light-emitting device provided with the same, and a method for producing a fluorescent material.

BACKGROUND ART

As a white LED, a two-color mixing LED which combines a semiconductor light-emitting element that emits blue light and a yellow fluorescent material to obtain white light by mixing colors of blue and yellow is widely used. However, the white light emitted by the two-color mixing white LED has a problem of low purity. Therefore, recently, a three-color mixing white LED which obtains white light by mixing colors of blue, green and red by combining a semiconductor light-emitting element that emits ultraviolet light (wavelength of 350 to 430 nm) and three types of fluorescent materials of blue, green and red and exciting the respective fluorescent materials with light from the semiconductor light-emitting element has been developed.

Conventionally, blue fluorescent materials having various compositions have been developed. For example, Patent Literature 1 describes an SMS blue light-emitting fluorescent material having a basic composition formula represented by $Sr_{3-x}MgSi_2O_8:Eu_x$ (x is 0.008 to 0.110), having the same crystal structure as merwinite and having a crystal lattice distortion of 0.055% or less. It is described that this SMS blue light-emitting fluorescent material shows high emission intensity and high stability to heat. Also, in the examples of this literature, a blue fluorescent material having a crystal lattice distortion of 0.031 to 0.066% is described.

Also, Patent Literature 2 describes a blue light-emitting fluorescent material having a basic composition formula of $(Sr,Ca)_3MgSi_2O_8$ activated by Eu and having a merwinite crystal structure, wherein the molar ratio of Sr to Ca is in the range of 1:0.10 to 1:0.30. It is described that a part of Sr is replaced with Ca so as to achieve above-described molar ratio, whereby the emission intensity under a high temperature environment around 120° C. (100 to 150° C.) is high, and the temperature stability of emission intensity is improved. In addition, it is described that the blue fluorescent material of this literature is produced by drying a slurry of raw material powder with a rotary evaporator.

Furthermore, Patent Literature 3 describes a blue fluorescent material including a compound represented by $Me_3MgSi_2O_8:Eu$ (wherein Me is at least one of Ca, St and Ba). In the example of this literature, a blue fluorescent material (sample No. 3) that is $(Sr,Ca)_3MgSi_2O_8:Eu$ (Ca/Sr=0.1/1, x=0.1) and produced by a spraying method is described. It is described that the spraying method is a method of producing an aqueous solution containing raw materials for a fluorescent material by spraying it in a heated oven, and the mixed solution of raw materials is heated to 1500° C. while applying supersonic waves from a nozzle and sprayed.

CITATION LIST

Patent Literature

Patent Literature 1: JP 2010-209206 A (claim 1, paragraphs 0010, 0040, and the like)
Patent Literature 2: JP 2013-35957 A (claim 1, paragraphs 0030, 0037, and the like)
Patent Literature 3: WO 2003/097767 (claim 1, page 5, page 17, Table 1, and the like)

SUMMARY OF INVENTION

Technical Problem

It is desirable that white LED exhibits an emission spectrum close to sunlight, and sunlight has a wide wavelength spectrum. Therefore, in order to improve the color rendering properties of white LED, it is necessary to widen the emission spectrum of each fluorescent material emitting each color, that is, to increase a full width at half maximum.

However, the blue fluorescent material described in Patent Literature 1 has relatively low crystal lattice distortion within the range of 0.031 to 0.066%, so that the elements in the fluorescent material are in a state close to an ideal arrangement, and therefore, the full width at half maximum of the emission spectrum is relatively small. In addition, since this blue fluorescent material does not contain Ca, the emission intensity under high temperature environment and the temperature stability of emission intensity are likely to be relatively low as compared with the blue fluorescent material containing Ca.

Also, as to the blue fluorescent material described in Patent Literature 2, the above crystal lattice distortion is not mentioned. The blue fluorescent material of this literature is produced by drying a slurry of raw material powder with a rotary evaporator. That is, it is considered that, in the production method of this literature, drying of the slurry is performed under relatively mild conditions, so that the elements in the fluorescent material are in a state close to an ideal arrangement, and therefore, the full width at half maximum of the emission spectrum is relatively small.

On the other hand, the blue fluorescent material described in Patent Literature 3 is produced by spraying a raw material slurry in a furnace at 1500° C. It is considered that drying is rapidly performed at a very high temperature exceeding 1000° C., thus the arrangement of the elements in the fluorescent material is disturbed (that is, the value of the crystal lattice distortion is large), and the emission efficiency is low.

An object of the present invention is to provide a fluorescent material that can improve color rendering properties particularly in a white LED, and a light-emitting device using the same.

Solution to Problem

In order to achieve the above objects, the present inventors have conducted extensive studies and have consequently found that, in a fluorescent material having a predetermined composition obtained by activating magnesium-containing barium strontium silicate by europium, the crystal lattice distortion is kept within a predetermined range, whereby the value of full width at half maximum is large, and in particular, the light emission characteristic suitable for use as a white LED is obtained.

That is, the present invention is a fluorescent material characterized by being represented by a composition of the following formula (1) and having a crystal lattice distortion obtained from a Williamson-Hall plot by X-ray diffraction within the range of 0.0005 to 0.0020.

$$(Sr,Ca,M)_{3-x}MgSi_2O_8:Eu_x \quad \text{formula (1)}$$

wherein M is at least one rare earth metal elements selected from the group consisting of Sc, Y, Gd, Tb and La, and $0.01 \leq x \leq 0.10$.

Also, the present invention relates to a light-emitting device including the above-described fluorescent material and a light source that emits light by irradiating the fluorescent material with excitation light.

Furthermore, the present invention relates to a method for producing the fluorescent material, including the steps of: obtaining an aqueous slurry of a raw material; and spray-drying the aqueous slurry with hot air at 80 to 300° C.

Advantageous Effects of Invention

According to the present invention, since the full width at half maximum of the emission spectrum of the fluorescent material is wide, it is possible to provide a fluorescent material that can improve color rendering properties particularly when used in a white LED and a light-emitting device using the same, and a method for producing a fluorescent material.

BRIEF DESCRIPTION OF DRAWINGS

FIG. 1 is a graph that illustrates an emission spectrum of a fluorescent material of an example.

DESCRIPTION OF EMBODIMENTS

1. Fluorescent Material

The fluorescent material of the present invention is represented by a composition of the following formula (1).

$$(Sr,Ca,M)_{3-x}MgSi_2O_8:Eu_x \quad \text{formula (1)}$$

wherein M is at least one rare earth metal elements selected from the group consisting of Sc, Y, Gd, Tb and La, and $0.01 \leq x \leq 0.10$.

In other words, the fluorescent material of the present invention is a silicate blue fluorescent material having a predetermined composition obtained by activating magnesium-containing calcium strontium silicate by europium.

Europium is an activator and has a property of emitting light as a light-emitting atom in a fluorescent material. The molar ratio of europium to 1 mol of Si, that is, the value of x is within the range of $0.01 \leq x \leq 0.10$, preferably within the range of $0.02 \leq x \leq 0.07$, and more preferably within the range of $0.03 \leq x \leq 0.40$. When the value of x is less than 0.01, the emission intensity is likely to decrease because the number of light-emitting atoms decreases, and when the value of x exceeds 0.1, the emission intensity is likely to decrease because the light-emitting atoms become high concentration and come close to each other to cancel the emission. In addition, the molar ratio of magnesium and the rare earth metal element M (Mg:M) is usually within the range of 1:0.0001 to 1:0.03, and particularly preferably within the range of 1:0.001 to 1:0.01. When the molar ratio is within the range of 1:0.0001 to 1:0.03, it is preferred because the fluorescent material shows high emission intensity.

Here, the fluorescent material of the present invention preferably contains calcium. Although the molar ratio of strontium and calcium (Sr:Ca) is not particularly limited, it is preferably within the range of 1:0.03 to 1:0.09, and particularly preferably within the range of 1:0.05 to 1:0.08. When the ratio of calcium to strontium is less than 0.03, the emission intensity is likely to be low, and when the ratio of calcium to strontium exceeds 0.09, the full width at half maximum of the emission spectrum is likely to be narrow.

The fluorescent material of the present invention has a crystal lattice distortion within the range of 0.0005 to 0.0020. Here, the crystal lattice distortion is an index representing the disturbance of the crystal structure. In the crystal structure, a state in which all elements are arranged regularly is an ideal state. For example, the crystal structure may deviate from the ideal state, in the case where an atom is missing from a position where an atom should originally exist, in the case where there is an atom at a position where an atom does not originally exist, in the case where an impurity atom occupies the same position instead of the original atom, and the like. An index representing the degree of this deviation is crystal lattice distortion. When the crystal lattice distortion is less than 0.0005, the full width at half maximum of the emission spectrum decreases, and when the crystal lattice distortion exceeds 0.0020, the emission efficiency is likely to be low. The crystal lattice distortion is preferably within the range of 0.0007 to 0.0015, and more preferably within the range of 0.0008 to 0.0010.

Here, the crystal lattice distortion is a value calculated by determining inclination η by "Williamson-Hall plot" that plots "2 (sin θ/λ)" on a horizontal axis and "β(cos θ/λ)" on a vertical axis, according to the following formula (A).

$$\beta(\cos \theta/\lambda)=2\eta(\sin \theta/\lambda)+1/D \quad \text{(A)}$$

wherein the meaning of each symbol is as follows: β: full width at half maximum of the X-ray diffraction peak, λ: wavelength (1.54059 Å), η: lattice distortion, D: crystallite size.

The full width at half maximum β of the X-ray diffraction peak can be measured as a width at which the peak of the X-ray diffraction intensity is ½ when the X-ray is irradiated to the fluorescent material, and the diffraction angle is 2θ. For details of the calculation method of crystal lattice distortion, a reference can be made to the method described in the examples described later.

Since the fluorescent material of the present invention has the characteristics described above, the full width at half maximum of the emission spectrum becomes relatively large, and specifically, the full width at half maximum can be made to 38.5 or more. Therefore, the fluorescent material of the present invention can improve color rendering properties particularly when used as a light-emitting element of a white LED. Here, the full width at half maximum means a wavelength width when the emission spectrum is measured when setting a vertical axis as emission intensity and a horizontal axis as wavelength, and the emission intensity becomes I/2 when the emission intensity at the peak of the emission spectrum is defined as I.

2. Method for Producing Fluorescent Material

The fluorescent material of the present invention is produced, for example, by mixing (mixing step) a strontium compound powder, a calcium compound powder, a silicon compound powder, a magnesium compound powder, a europium compound powder, and a rare earth metal compound powder containing a rare earth metal element M, and then spray-drying the obtained aqueous slurry (spray-drying step), and firing the obtained powder mixture (firing step).

(1) Mixing Step

Each raw material powder of the strontium compound powder, the calcium compound powder, the silicon compound powder, the magnesium compound powder, the europium compound powder, and the rare earth metal compound powder may be an oxide powder, or may be a compound powder generating an oxide by heating a hydroxide, a halide, a carbonate (including a basic carbonate), a nitrate, an oxalate, or the like.

Specific examples of the strontium compound powder are not particularly limited, but, for example, one or more kinds selected from the group consisting of strontium carbonate ($SrCO_3$), strontium hydroxide ($Sr(OH)_2$), strontium fluoride ($SrF_2$), strontium bromide ($SrBr_2$), strontium chloride ($SrCl_2$) and strontium iodide ($SrI_2$) can be used.

Specific examples of the calcium compound powder are not particularly limited, but, for example, one or more kinds selected from the group consisting of calcium carbonate ($CaCO_3$), calcium hydroxide ($Ca(OH)_2$), calcium fluoride ($CaF_2$), calcium bromide ($CaBr_2$), calcium chloride ($CaCl_2$) and calcium iodide ($CaI_2$) can be used.

Specific examples of the silicon compound powder are not particularly limited, but, for example, one or more kinds selected from the group consisting of silicon dioxide ($SiO_2$), orthosilicic acid ($H_4SiO_4$), metasilicic acid ($H_2SiO_3$) and metadisilicic acid ($H_2Si_2O_5$) can be used.

Specific examples of the magnesium compound powder are not particularly limited, but, for example, one or more kinds selected from the group consisting of magnesium oxide (MgO), magnesium hydroxide ($Mg(OH)_2$) and magnesium carbonate ($MgCO_3$) can be used.

Specific examples of the europium compound powder are not particularly limited, but, for example, one or more kinds selected from the group consisting of europium(III) oxide ($Eu_2O_3$), europium(II) oxide (EuO) and europium(III) hydroxide ($Eu(OH)_3$) can be used.

Specific examples of the rare earth metal compound powder are not particularly limited, but, for example, one or more kinds selected from the group consisting of scandium (III) oxide ($Sc_2O_3$), scandium(III) hydroxide ($Sc(OH)_3$), yttrium(III) oxide ($Y_2O_3$), yttrium(III) hydroxide ($Y(OH)_3$), gadolinium(III) oxide ($Gd_2O_3$), gadolinium(III) hydroxide ($Gd(OH)_3$), terbium(III) oxide ($Tb_2O_3$), terbium(III) hydroxide ($Tb(OH)_3$), lanthanum(III) oxide ($La_2O_3$) and lanthanum(III) hydroxide ($La(OH)_3$) can be used.

Each of these raw material powders may be used singly or in combination of two or more kinds. Each raw material powder preferably has a purity of 99% by mass or more.

Since the mixing ratio of the above-mentioned raw material powder is almost same as the composition ratio of the formula (1), the mixing ratio is adjusted so as to obtain a desired composition ratio. That is, the strontium compound powder, the calcium compound powder and the rare earth metal compound powder are mixed so that the total number of moles of the strontium element, the calcium element and the rare earth metal element M becomes "3−x", with respect to 1 mol of the silicon content of the raw material powder. The same applies to other compound powders.

To the mixture of raw material powders may be added a flux. The flux is preferably a halide, and particularly preferably a chlorine compound. It is preferable to use a chlorine compound powder as a part of raw material powder as a flux. In particular, it is preferable to use a chlorine compound powder of strontium. The amount of flux to be added is an amount such that the amount of halogen is preferably in the range of 0.0001 to 0.5 mol, and particularly preferably in the range of 0.01 to 0.5 mol, based on 1 mol of the silicon content in the powder mixture.

In the mixing step, raw material powders are mixed in a solvent by a wet mixing method to obtain an aqueous slurry of raw materials. As the wet mixing method, a rotating ball mill, a vibration ball mill, a planetary mill, a paint shaker, a rocking mill, a rocking mixer, a bead mill, a stirrer or the like can be used. As the solvent, water, or a lower alcohol such as ethanol or isopropyl alcohol can be used.

(2) Spray-drying Step

Next, the obtained aqueous slurry is spray-dried with hot air at 80 to 300° C. Spray drying is a method in which an aqueous slurry is sprayed to be brought into contact with hot air, and the solvent in the aqueous slurry is evaporated to obtain a granulated powder. Spray drying can be carried out using a known spray dryer, for example, a rotary atomizer or a disk atomizer that is a rotating disk type, a nozzle atomizer that is a nozzle injection type or the like can be used. Thereby, a powder mixture of each raw material can be obtained. In the case of a rotating disk atomizer, its rotation speed is usually within the range of 10,000 to 20,000 rpm.

In spray drying, it is considered that, since the raw material slurry formed into a droplet is rapidly dried, a reaction occurs in a state where the elements are not uniform, the number of elements in which the elements in the fluorescent material deviate from the ideal crystal arrangement increases, and the crystal lattice distortion is likely to occur. On the other hand, at a high temperature such that the drying temperature exceeds, for example, 1000° C., the number of elements deviating from the ideal crystal arrangement increases so much that the emission efficiency is likely to be lowered, thus the drying temperature is preferably within the range of 80 to 300° C. Therefore, by setting the temperature of the hot air within the range of 80 to 300° C. by the spray-drying method, the number of the elements deviating from the ideal crystal structure in the fluorescent material to be obtained is set within an appropriate range, and the full width at half maximum of the emission spectrum can be set within the optimum range.

(3) Firing Step

Next, firing of the powder mixture is carried out. Firing of the powder mixture is preferably carried out under a reducing gas atmosphere. As the reducing gas, a mixed gas of 0.5 to 5.0% by volume of hydrogen and 99.5 to 95.0% by volume of an inert gas can be used. Examples of the inert gas include argon and/or nitrogen. The firing temperature is generally within the range of 900 to 1300° C. The firing time is generally within the range of 0.5 to 100 hours, and preferably within the range of 0.5 to 10 hours.

In the case of using a powder of a compound which generates an oxide by heating as a raw material powder, it is preferred that, before firing under a reducing gas atmosphere, the powder mixture is calcined at a temperature of 600 to 850° C. for 0.5 to 100 hours under an air atmosphere. The calcination time is particularly preferably within the range of 0.5 to 10 hours. The fluorescent material obtained by firing may be subjected to a classification treatment, an acid washing treatment with a mineral acid such as hydrochloric acid or nitric acid, and a baking treatment, as necessary.

3. Light-Emitting Device

The fluorescent material of the present invention can be used for various light-emitting devices. The light-emitting device of the present invention includes at least the fluorescent material represented by the above formula (1) and a light source that emits light by irradiating the fluorescent material with excitation light. Specific examples of the light-emitting device include a white light-emitting diode (LED), a fluorescent light, a vacuum fluorescent display (VFD), a cathode ray tube (CRT), a plasma display panel (PDP), a field emission display (FED), and the like. Among them, the white LED is a light-emitting device which includes the fluorescent material of the present invention (blue fluorescent material), a red fluorescent material, a green fluorescent material, and for example, a semiconductor light-emitting element that emits ultraviolet light having a wavelength of 350 to 430 nm, and excites these fluorescent materials with ultraviolet light from the light-emitting element to obtain white color by mixing colors of blue, red and green.

Examples of red light-emitting fluorescent materials include $(Ba,Sr,Ca)_3MgSi_2O_8:Eu,Mn$, $Y_2O_2S:Eu$, $La_2O_3S:Eu$, $(Ca,Sr,Ba)_2Si_5N_8:Eu$, $CaAlSiN_3:Eu$, $Eu_2W_2O_9$, $(Ca,Sr,Ba)_2Si_5N_8:Eu,Mn$, $CaTiO_3:Pr,Bi$, $(La,Eu)_2W_3O_{12}$, and the like. Also, examples of green light-emitting fluorescent materials include $(Mg,Ca,Sr,Ba)Si_2O_2N_2:Eu$, $(Ba,Ca,Sr,Mg)_2SiO_4:Eu$, and the like. The semiconductor light-emitting element includes AlGaN-based semiconductor light-emitting elements. For details of the light-emitting device, a reference can be made to Patent Literature 2.

EXAMPLES

Hereinafter, the present invention is specifically described with reference to Examples, but these Examples do not limit the object of the present invention.

1. Example 1

Using $SrCO_3$ powder, $SrCl_2.6H_2O$ powder, $CaCO_3$ powder, $Eu_2O_3$ powder, $Y_2O_3$ powder, MgO powder, and $SiO_2$ powder as raw material powder, the raw material powder was weighed so that the molar ratio of $SrCO_3:SrCl_2.6H_2O:CaCO_3:Eu_2O_3:MgO:SiO_2$ was 2.697:0.100:0.163:0.0175:0.0025:1:2.000. Each weighed powder was wet-mixed in water using a ball mill for 15 hours to obtain a slurry of the powder mixture.

The obtained slurry was dried with a spray dryer to obtain a dry powder. The spray dryer was operated using model FOC-25 manufactured by OHKAWARA KAKOHKI CO., LTD., under conditions of hot air temperature in an inlet of 220 to 240° C. and an outlet of 90 to 110° C., and an atomizer rotation speed of 12600 to 12800 rpm. The obtained dry powder was placed in an alumina setter, fired at a temperature of 780° C. for 3 hours under an air atmosphere, subsequently, allowed to cool to room temperature, and then fired at a temperature of 1250° C. for 3 hours under a mixed gas atmosphere of 3% by volume hydrogen-97% by volume argon to produce a fluorescent material.

<Measurement of Crystal Lattice Distortion>

The crystal lattice distortion of the obtained fluorescent material was measured with a wide-angle X-ray diffractometer (RINT-TTRIII type) manufactured by Rigaku Corporation. Measurement conditions of crystal lattice distortion were as follows: X-ray source: CuKα ray, tube voltage–tube current: 50 kV–300 mA, step width: 0.02 deg., measurement speed: 1 sec./step. The result is shown in Table 2.

<Measurement of Full Width at Half Maximum>

The emission spectrum of the fluorescent material was measured with a spectrofluorophotometer (FP-6500) manufactured by JASCO Corporation. The obtained emission spectrum is shown in FIG. 1. In this emission spectrum, the maximum peak intensity (I) was obtained in the wavelength range of 400 to 500 nm, and the wavelength range to be I/2 was calculated and defined as the full width at half maximum. The result is shown in Table 2.

<Measurement of External Quantum Efficiency>

Using the obtained fluorescent material as a sample, a measurement was performed according to the following procedure, using FP-8500 manufactured by JASCO ENGINEERING CO., LTD.

1) A standard white plate was attached to the inner bottom of the integrating sphere. This standard white plate was irradiated with ultraviolet light having a peak wavelength of 400 nm vertically to its surface. The spectrum of light scattered by the integrating sphere wall was measured, and the peak area (L1) of light having a wavelength of 380 to 410 nm was measured.

2) The fluorescent material sample was filled in a sample holder, and the sample holder was attached to the inner bottom of the integrating sphere. The fluorescent material sample of the sample holder was irradiated with ultraviolet light having a peak wavelength of 400 nm vertically to its surface. The spectrum of light scattered by the integrating sphere wall was measured, and the peak area (L2) of light having a wavelength of 380 to 410 nm and the peak area (E) of light of a wavelength of 410 to 700 nm were measured. Then, the external quantum efficiency of the fluorescent material sample was calculated from the following formula.

External Quantum Efficiency (%)=100×$E/L1$

<Measurement of Emission Intensity>

The maximum peak intensity was determined in the wavelength range of 400 to 500 nm of the emission spectrum obtained by "<Measurement of full width at half maximum>" described above, and this was used as the emission intensity.

2. Example 2

A fluorescent material was produced in the same manner as in Example 1, except that the raw materials were mixed so that the molar ratio of the raw materials is the raw material mixing ratio (Example 2) in Table 1, and the spray dryer was operated at an atomizer rotation speed of 12900 to 13100 rpm. Crystal lattice distortion and full width at half maximum of the obtained fluorescent material were measured. The result is shown in Table 2. Also, external quantum efficiency and emission intensity were measured in the same manner as in Example 1. The result is shown in Table 3.

3. Examples 3, 4

A fluorescent material was produced in the same manner as in Example 1, except that the raw materials were mixed so that the molar ratio of the raw materials is the raw material mixing ratio (Examples 3 and 4) in Table 1. Crystal lattice distortion and full width at half maximum of the obtained fluorescent material were measured. The result is shown in Table 2. Also, external quantum efficiency and emission intensity were measured in the same manner as in Example 1. The result is shown in Table 3.

4. Comparative Example 1

A fluorescent material was produced in the same manner as in Example 1, except that the slurry obtained in the same manner as in Example 1 was dried with a rotary evaporator, the obtained dry powder was placed in an alumina crucible and fired in an air atmosphere, and fired under a mixed gas atmosphere of 2% by volume hydrogen-98% by volume argon after cooling to room temperature. Crystal lattice distortion and full width at half maximum of the obtained fluorescent material were measured. The result is shown in Table 2.

5. Comparative Examples 2 to 4

A fluorescent material was produced in the same manner as in Comparative Example 1, except that the molar ratio of the raw material powder was set as shown in Table 2. Crystal lattice distortion and full width at half maximum of the obtained fluorescent material were measured. The result is shown in Table 2.

TABLE 1

| | Raw material mixing ratio $SrCO_3:SrCl_2 \cdot 6H_2O:CaCO_3:Eu_2O_3:Y_2O_3:MgO:SiO_2$ | Fluorescent material composition |
|---|---|---|
| Example 1 (Ca 5.5%) | 2.697:0.100:0.163:0.0175:0.0025:1:2.000 | $Sr_{2.797}Ca_{0.163}Eu_{0.035}Y_{0.005}MgSi_2O_8$ |
| Example 2 (Ca 6.0%) | 2.682:0.100:0.178:0.0175:0.0025:1:2.000 | $Sr_{2.782}Ca_{0.178}Eu_{0.035}Y_{0.005}MgSi_2O_8$ |
| Example 3 (Ca 6.5%) | 2.668:0.100:0.193:0.0175:0.0025:1:2.000 | $Sr_{2.768}Ca_{0.192}Eu_{0.035}Y_{0.005}MgSi_2O_8$ |
| Example 4 (Ca 7.0%) | 2.653:0.100:0.208:0.0175:0.0025:1:2.000 | $Sr_{2.753}Ca_{0.207}Eu_{0.035}Y_{0.005}MgSi_2O_8$ |
| Comparative Example 1 (Ca 5.5%) | 2.697:0.100:0.163:0.0175:0.0025:1:2.000 | $Sr_{2.797}Ca_{0.163}Eu_{0.035}Y_{0.005}MgSi_2O_8$ |
| Comparative Example 2 (Ca 6.0%) | 2.682:0.100:0.178:0.0175:0.0025:1:2.000 | $Sr_{2.782}Ca_{0.178}Eu_{0.035}Y_{0.005}MgSi_2O_8$ |
| Comparative Example 3 (Ca 6.5%) | 2.668:0.100:0.193:0.0175:0.0025:1:2.000 | $Sr_{2.768}Ca_{0.192}Eu_{0.035}Y_{0.005}MgSi_2O_8$ |
| Comparative Example 4 (Ca 7.0%) | 2.653:0.100:0.208:0.0175:0.0025:1:2.000 | $Sr_{2.753}Ca_{0.207}Eu_{0.035}Y_{0.005}MgSi_2O_8$ |

TABLE 2

| | Sr:Ca = 1:x | Crystal lattice distortion | full width at half maximum |
|---|---|---|---|
| Example 1 (Ca 5.5%) | 0.058 | 0.001 | 38.8 |
| Example 2 (Ca 6.0%) | 0.064 | 0.0009 | 38.7 |
| Example 3 (Ca 6.5%) | 0.070 | 0.001 | 38.6 |
| Example 4 (Ca 7.0%) | 0.075 | 0.0008 | 39.1 |
| Comparative Example 1 (Ca 5.5%) | 0.058 | 0.0002 | 37.8 |
| Comparative Example 2 (Ca 6.0%) | 0.064 | 0 | 37.7 |
| Comparative Example 3 (Ca 6.5%) | 0.070 | 0.0003 | 38.2 |
| Comparative Example 4 (Ca 7.0%) | 0.075 | 0 | 38.5 |

TABLE 3

| | Crystal lattice distortion | full width at half maximum | External quantum efficiency | Emission intensity |
|---|---|---|---|---|
| Example 1 (Ca 5.5%) | 0.001 | 38.8 | 60.3 | 281.6 |
| Example 2 (Ca 6.0%) | 0.0009 | 38.7 | 59.8 | 287.7 |
| Example 3 (Ca 6.5%) | 0.001 | 38.6 | 60.7 | 277.6 |
| Example 4 (Ca 7.0%) | 0.0008 | 39.1 | 60.9 | 265.5 |

From the results in Table 2, comparing examples with comparative examples, it can be seen that the values of the full width at half maximum of examples with a crystal lattice distortion of 0.0008 to 0.001 are larger than that of comparative examples with a crystal lattice distortion of 0.0003 or less. Therefore, the fluorescent material dried by spray drying as in the example has larger full width at half maximum, as compared with the fluorescent material dried by rotary evaporator as in the comparative example. Therefore, it can be said that the fluorescent material dried by spray drying as in the example is more preferable as a fluorescent material of white LED, from the viewpoint of color rendering property.

In addition, from the results of Table 3, comparing examples each other, Example 4 in which the molar ratio of Sr:Ca is 1:0.075 has a larger full width at half maximum but a smaller emission intensity. Therefore, it is considered preferable that the molar ratio of Ca to Sr is preferably higher from the viewpoint of the full width at half maximum, and is preferably lower from the viewpoint of the emission intensity.

The invention claimed is:

1. A fluorescent material characterized by being represented by a composition of the following formula (1)

$$(Sr,Ca,M)_{3-x}MgSi_2O_8:Eu_x \quad \text{formula (1)},$$

wherein M is at least one rare earth metal elements selected from the group consisting of Sc, Y, Gd, Tb and La, $0.01 \leq x \leq 0.10$, and a molar ratio of Mg to M, Mg:M, is 1:0.0001 to 1:0.03, and having a crystal lattice distortion obtained from a Williamson-Hall plot by X-ray diffraction within a range of 0.0005 to 0.0020.

2. The fluorescent material according to claim 1, wherein a molar ratio of Sr to Ca (Sr:Ca) is 1:0.03 to 1:0.09.

3. The fluorescent material according to claim 1, wherein a full width at half maximum of an emission spectrum is 38.5 or more.

4. A light-emitting device comprising the fluorescent material as defined in any one of claims 1 to 3, and a light source that emits light by irradiating the fluorescent material with excitation light.

5. A method for producing the fluorescent material as defined in claim 1, comprising the steps of:
   obtaining an aqueous slurry of a raw material;
   spray-drying the aqueous slurry with hot air at 80 to 300° C. to form a powder; and
   firing the powder at 900 to 1300° C.

6. The fluorescent material according to claim 2, wherein a full width at half maximum of an emission spectrum is 38.5 or more.

7. A method for producing the fluorescent material as defined in claim 2, comprising the steps of:
   obtaining an aqueous slurry of a raw material;
   spray-drying the aqueous slurry with hot air at 80 to 300° C. to form a powder; and
   firing the powder at 900 to 1300° C.

8. A method for producing the fluorescent material as defined in claim 3, comprising the steps of:
   obtaining an aqueous slurry of a raw material;
   spray-drying the aqueous slurry with hot air at 80 to 300° C. to form a powder; and
   firing the powder at 900 to 1300° C.

* * * * *